United States Patent [19]
Fukui et al.

[11] Patent Number: 5,273,634
[45] Date of Patent: Dec. 28, 1993

[54] METHOD AND APPARATUS FOR HOT-DIPPING STEEL STRIP

[75] Inventors: Yasushi Fukui; Tadaaki Miono; Kazunari Nakamoto; Tsuguyasu Yoshii, all of Osaka, Japan

[73] Assignee: Nisshin Steel Co., Ltd., Tokyo, Japan

[21] Appl. No.: 857,004

[22] Filed: Mar. 25, 1992

[30] Foreign Application Priority Data

Mar. 26, 1991 [JP] Japan .................. 3-086169

[51] Int. Cl.$^5$ .................. C23C 14/34; B05D 1/18
[52] U.S. Cl. .................. 204/192.34; 204/192.35; 204/298.33; 204/298.36; 427/434.2; 427/435
[58] Field of Search .................. 204/192.32, 192.34, 204/192.35, 298.23, 298.24, 298.25, 298.36, 298.33; 427/434.2, 434.7, 309, 435

[56] References Cited

U.S. PATENT DOCUMENTS

| | | | |
|---|---|---|---|
| 3,326,177 | 6/1967 | Taylor | 204/298.35 X |
| 3,409,529 | 11/1968 | Chopra et al. | 204/298.24 X |
| 3,565,677 | 2/1971 | Dion et al. | 427/434.7 X |
| 4,169,426 | 10/1979 | Kornmann et al. | 427/434.7 X |
| 4,269,137 | 5/1981 | Johnson | 204/298.35 X |
| 4,431,688 | 2/1984 | Kornmann | 427/434.7 X |
| 5,057,199 | 10/1991 | Lievens et al. | 204/298.24 X |

*Primary Examiner*—Nam Nguyen
*Attorney, Agent, or Firm*—Nikaido, Marmelstein, Murray & Oram

[57] ABSTRACT

A steel strip is cleaned by sputtering-etching with ion beams of argon. By the sputtering-etching, an oxide film of easily oxidable elements such as chromium and silicon is removed. The cleaned steel strip is hot-dipped.

11 Claims, 1 Drawing Sheet

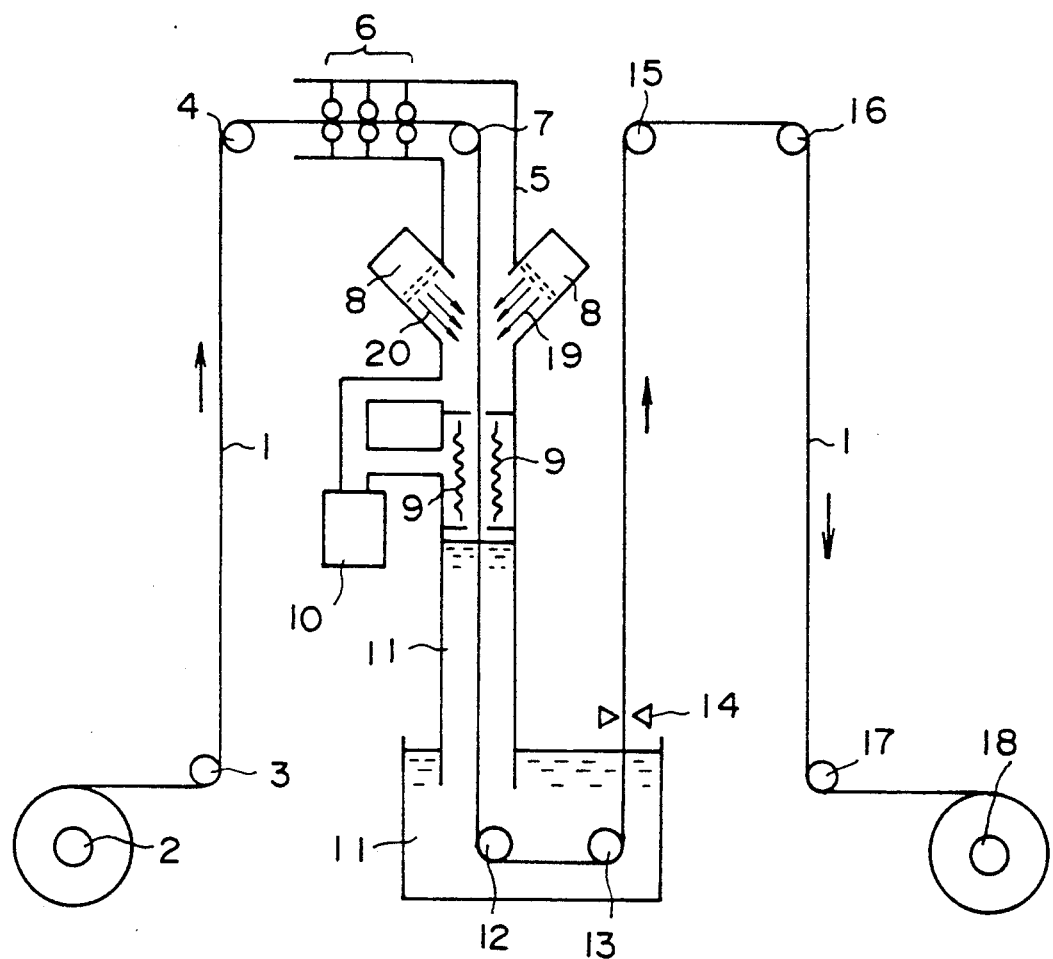

METHOD AND APPARATUS FOR HOT-DIPPING STEEL STRIP

BACKGROUND OF THE INVENTION

The present invention relates to a method and an apparatus for continuously hot-dipping steel strips, wherein a pretreatment of the steel is improved for plating.

A hot dipping apparatus for steel strip is provided with a pretreating device for removing an oxide film on a steel strip before plating, thereby improving wettability of the steel and preventing the formation of bare spots on the steel strip. In the pretreating device, the steel strip is heated to anneal and remove combustible impurities at the same time. Thereafter, the steel strip is reduced by reducing gas.

However, in cases where the steel contains easily oxidizable elements such as chromium, silicon and aluminum, such steel being for example stainless steel, the oxide film can not be removed by the reducing gas. Consequently, the pretreated steel strip has low wettability.

The hot dipping is performed by an intermetallic reaction, and the reaction is influenced by the easily oxidizable elements. Therefore, defects such as bare spots are liable to occur on the steel containing easily oxidizable elements.

Such a steel strip containing easily oxidizable elements can be plated by vacuum deposition, if the strip is heated.

If the steel strip contains easily oxidizable elements of the steel strip can be electroplated before the hot dipping, the wettability of the strip can be improved, thereby providing a product without defects. However, such a method renders the manufacturing process complicated, thereby increasing the manufacturing cost.

SUMMARY OF THE INVENTION

An object of the present invention is to provide a hot dipping method and apparatus in which the surface of a steel strip is activated by sputtering-etching, thereby developing the wettability of the steel strip and preventing the formation of the bare spot in the plating surface.

According to the present invention, there is provided a hot dipping method for a steel strip comprising the steps of cleaning the surface of the steel strip by sputtering-etching with ion beams and hot-dipping the steel strip. At sputtering-etching, if the temperature of the steel strip is lower than the temperature for the hot-dipping plating, the steel is heated at the same time.

A hot dipping apparatus comprises a vacuum chamber provided on the upstream of a hot dipping bath. The vacuum chamber has an ion beam ejecting device provided on opposite sides of a path line of the steel strip.

Any element or molecules can be used for the ion beam for sputtering-etching. However, it is advantageous to use an ion beam of argon in consideration of easy handling, low cost, corrosion resistance after plating, and high speed treatment. In the sputtering-etching, ion beams impact the surface of the steel strip to splash atoms thereon by the sputtering effect and to etch the surface. Consequently, the oxide film of easily oxidizable elements is removed from the surface of the steel strip.

Even if argon gas leaks from the ejecting device into the vacuum chamber, the surface of the steel is maintained in a clean condition until the steel strip is dipped in the hot dipping bath.

A portion of the kinetic energy of the ion beam impacted to the steel strip changes to heat energy. As a result, the temperature of the steel strip properly increases for the hot dipping. If the temperature of the steel is insufficient, the steel strip is heated by heaters in the vacuum chamber.

The other objects and features of this invention will become understood from the following description with reference to the accompanying drawings.

BRIEF DESCRIPTION OF DRAWINGS

The single FIGURE is a schematic illustration showing a hot dipping apparatus according to the present invention.

DETAILED DESCRIPTION OF THE PREFERRED EMBODIMENT

Referring to the drawing, a steel strip 1 is fed from a pay off reel 2 to a vacuum chamber 5 through deflector rollers 3 and 4. A sealing device 6 of a roller type is provided in the vacuum chamber 5 adjacent to an inlet thereof. The vacuum chamber 5 is further provided with a deflector roller 7 for downwardly guiding the steel strip 1, ion beam ejecting devices 8, and heaters 9 both of which are provided on opposite sides of the path of the steel strip. A vacuum pump 10 communicates with the vacuum chamber 5 in order to maintain the pressure in the chamber 5 at a predetermined reducing atmosphere. An outlet of the chamber 5 is immersed in a hot dipping bath 11. The bath 11 also serves as a sealing device for the outlet of the chamber 5. The steel strip 1 is heated by the heaters 9 to the same temperature as the bath 11.

In the bath 11, immersion rollers 12 and 13 are disposed to guide the strip in the bath. The steel strip 1 is guided in the upper direction by the roller 3. The plating thickness is adjusted by a gas wiping device 14. The steel strip 1 is fed to a reel 18 through deflector rollers 15, 16 and 17 and wound thereon.

In order to perform sputtering-etching, the air in the chamber 5 is discharged to provide a low pressure of about $1 \times 10^{-3}$ Pa with the vacuum pump 10. Argon ion beams 19 and 20 are ejected from the ejecting devices 8 to the steel strip 1 for performing the sputtering-etching. During the operation, the temperature of the steel strip 1 is increased by the ion beams. If the temperature is insufficient for the plating, the heaters 9 are operated to heat the steel strip 1.

EXAMPLE

A degreased steel strip of SUS 430 stainless steel (finished material at 2B, having width of 100 mm and thickness of 0.5 mm) was plated with Aluminum alloy by hot dipping under the conditions shown in table 1. The temperature of the steel strip 1 was controlled to 650° C. by the heaters 9 before immersing in the bath.

TABLE 1

| Conditions of Sputtering-Etching and Hot Dipping | |
|---|---|
| ion beam | |
| ion | Ar+ |
| energy | 10 keV |
| current density | 2 mA/cm² |
| irradiation angle | 40 degrees |
| irradiation length | 30 cm |
| plating bath | |
| composition | Si 9.2 weight % |

TABLE 1-continued

| Conditions of Sputtering-Etching and Hot Dipping | |
|---|---|
| residual: inevitable impurities and Al | Fe 1.6 weight % |
| temperature | 650° C. |
| thickness | 20 μm (one side) |

The plating layer formed on the steel strip was examined to investigate the bare spot ratio and the adhesion thereof. The results are shown in table 2. The bare spot ratio represents the bare spot area per 0.05 m². The plating adhesion was investigated by two kinds bending tests. In the first test, the steel strip was bent at 180 degrees until the opposite bent portions engaged with each other (0 t bending). In the second test, the steel strip was bent at 180 degrees by interposing another steel strip having the same thickness there-between (1 t bending). Thereafter, a piece of a cellophane tape was stuck on the bent portion. Then, the tape is removed therefrom and the peeling off of the plating layer was examined. In the table, a mark ⊙ represents no peeling at 0 t bending. A mark ◯ represents the fact that a part of the plating layer is peeled off at 0 t bending and did not peel at 1 t bending. A mark Δ represents that a part of the plating layer peeled off at 1 t bending, and a mark x represents that the entire plating layer peeled off at 1 t bending.

TABLE 2

| Relationship Between Line Speed and Plating Condition | | |
|---|---|---|
| line speed (m/min) | bare spot ratio (%) | adhesion |
| present invention ion beam irradiation | | |
| 10 | 0 | ⊙ |
| 20 | 0 | ⊙ |
| 30 | 0 | ⊙ |
| 40 | 0 | ⊙ |
| 50 | 0 | ⊙ |
| 55 | 0 | ⊙ |
| 60 | 0 | ⊙ |
| comparative example no ion beam | | |
| 40 | 8 | ◯ |
| 50 | 15 | Δ |
| 55 | 39 | Δ |
| 60 | 63 | x |

From the table 2, it will be seen that if the steel strip is pretreated by sputtering-etching with ion beams, the steel strip is plated with a good adhesion without bare spot at a high operating speed. To the contrary, the comparative examples had bare spots. The bare spot ratio increases with the operating speed.

In accordance with the present invention, the surface of the steel strip to be hot-dipped is cleaned by sputtering-etching with the ion beam. Since the atoms on the surface of the steel strip are removed by collision of the ion beam, the steel including easily oxidizable elements is sufficiently activated. As a result, it is possible to hot-dip the steel strip with improving the adhesion without forming bare spots. The pretreating apparatus of the present invention can reduce the length of the line of the pretreatment so that starting or stopping of the apparatus can be easily performed.

While the presently preferred embodiment of the present invention has been described, it is to be understood that this disclosure is for the purpose of illustration and that various changes and modifications may be made without departing from the scope of the invention as set forth in the appended claims.

What is claimed is:

1. A method for hot-dipping a steel strip using an apparatus that incorporates a hot dipping bath, a vacuum chamber provided upstream of the hot dipping bath and positioned so as to have an outlet of the vacuum chamber feed directly into the hot dipping bath, ion beam ejecting means provided in the vacuum chamber upstream of the hot dipping bath, for activating a surface of the steel strip using ion beam sputtering-etching, the ion beam ejecting means being further for heating the steel strip prior to entering the hot dipping bath, and conveying means for conveying the steel strip to be treated through the vacuum chamber and directly into the hot dipping bath, said method comprising the steps of:
   conveying the steel strip to be treated through the vacuum chamber and the hot dipping bath;
   cleaning a surface of the steel strip by sputtering-etching with the ion beam ejecting means; and
   hot-dipping plating the steel strip through the hot dipping bath directly from the vacuum chamber.

2. A method according to claim 1, further comprising the step of: heating the steel strip when the temperature of the steel strip is lower than a temperature for the hot-dipping plating.

3. A method according to claim 1 wherein the sputtering-etching is performed by irradiating ion beams of argon.

4. An apparatus for hot-dipping a steel strip, comprising:
   a hot dipping bath;
   a vacuum chamber provided upstream of the hot dipping bath and positioned so as to have an outlet of said vacuum chamber feed directly into said hot dipping bath;
   ion beam ejecting means provided in the vacuum chamber upstream of said hot dipping bath, for activating a surface of the steel strip using ion beam sputtering-etching, said ion beam ejecting means being further for heating the steel strip prior to entering said hot dipping bath; and
   conveying means for conveying the steel strip to be treated through said vacuum chamber and said hot dipping bath.

5. An apparatus according to claim 4, wherein said ion beam ejecting means includes ion beam ejecting devices provided on opposite sides of a path line of the steel strip.

6. An apparatus according to claim 4, further comprising:
   heating means provided between said ion beam ejecting means and the outlet of said vacuum chamber, for heating the steel strip at least to a predetermined temperature for hot-dipping plating.

7. An apparatus according to claim 4, wherein said ion beam ejecting means includes means for ejecting argon ions.

8. An apparatus for hot-dipping a steel strip, comprising:
   a hot dipping bath;
   a vacuum chamber provided upstream of the hot dipping bath and positioned so as to have an outlet of said vacuum chamber feed into said hot dipping bath;
   ion beam ejecting means provided in the vacuum chamber upstream of said hot dipping bath, for activating a surface of the steel strip using ion beam sputtering-etching;

temperature determining means for determining if a temperature of the steel strip is within a predetermined temperature for hot-dipping plating;

heating means provided between said ion beam ejecting means and the outlet of said vacuum chamber, for heating the steel strip at least to the predetermined temperature for hot-dipping plating; and conveying means for conveying the steel strip to be treated through said vacuum chamber and said hot dipping bath.

9. An apparatus according to claim 8, wherein said ion beam ejecting means includes ion beam ejecting devices provided on opposite sides of a path line of the steel strip.

10. An apparatus according to claim 8, wherein said ion beam ejecting means includes means for ejecting argon ions.

11. An apparatus according to claim 8, wherein said vacuum chamber provided upstream of the hot dipping bath is further positioned so as to have the outlet thereof directly connected into said hot dipping bath.

* * * * *